US011417695B2

(12) United States Patent
Nakata et al.

(10) Patent No.: US 11,417,695 B2
(45) Date of Patent: Aug. 16, 2022

(54) PHOTOELECTRIC CONVERSION APPARATUS, IMAGING SYSTEM, AND MOVING BODY

(71) Applicant: CANON KABUSHIKI KAISHA, Tokyo (JP)

(72) Inventors: Yasushi Nakata, Yokohama (JP); Kazutoshi Torashima, Yokohama (JP); Shinichiro Shimizu, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 212 days.

(21) Appl. No.: 16/848,953

(22) Filed: Apr. 15, 2020

(65) Prior Publication Data
US 2020/0343287 A1    Oct. 29, 2020

(30) Foreign Application Priority Data

Apr. 26, 2019  (JP) .............................. JP2019-085947

(51) Int. Cl.
*H01L 27/146* (2006.01)
*H04N 5/357* (2011.01)

(52) U.S. Cl.
CPC .... *H01L 27/14623* (2013.01); *H01L 27/1464* (2013.01); *H01L 27/14614* (2013.01); *H01L 27/14636* (2013.01); *H01L 27/14638* (2013.01); *H01L 27/14645* (2013.01); *H04N 5/357* (2013.01)

(58) Field of Classification Search
CPC ......... H01L 27/14623; H01L 27/14638; H01L 27/14629; H01L 27/1464
See application file for complete search history.

(56) References Cited

U.S. PATENT DOCUMENTS

| 8,687,246 B2 | 4/2014 | Fujimura et al. |
| 8,710,610 B2 | 4/2014 | Kono et al. |
| 8,836,833 B2 | 9/2014 | Yamashita et al. |
| 8,866,205 B2 | 10/2014 | Nakata et al. |

(Continued)

FOREIGN PATENT DOCUMENTS

JP    2013-065688 A    4/2013

OTHER PUBLICATIONS

U.S. Appl. No. 16/848,946, filed Apr. 15, 2020 (First Named Inventor: Yasushi Nakata).

*Primary Examiner* — David A Zarneke
(74) *Attorney, Agent, or Firm* — Venable LLP

(57) ABSTRACT

A photoelectric conversion apparatus, including: a semiconductor substrate having a first surface on which light is incident and a second surface; a photoelectric converting unit configured to convert incident light into charge; a charge holding unit configured to hold charge; a light shielding unit provided in a trench of the semiconductor substrate, the trench being formed between the photoelectric converting unit and the charge holding unit; and a transfer gate formed on a second surface side of the semiconductor substrate so as to overlap with the light shielding unit when viewed in a plan view for the second surface of the semiconductor substrate and configured to transfer the charge at the photoelectric converting unit to the charge holding unit, wherein a distance between the light shielding unit and the photoelectric converting unit is shorter than a distance between the light shielding unit and the charge holding unit.

20 Claims, 9 Drawing Sheets

(56) References Cited

U.S. PATENT DOCUMENTS

| | | |
|---|---|---|
| 8,964,081 B2 | 2/2015 | Ohkubo et al. |
| 9,640,577 B2 * | 5/2017 | Oh .................... H01L 27/1463 |
| 9,681,078 B2 | 6/2017 | Tsuchiya et al. |
| 10,453,885 B2 * | 10/2019 | Iwabuchi ................ H01L 27/14 |
| 2012/0008030 A1 | 1/2012 | Kono et al. |

* cited by examiner

PHOTOELECTRIC CONVERSION APPARATUS, IMAGING SYSTEM, AND MOVING BODY

BACKGROUND OF THE INVENTION

Field of the Invention

The present invention relates to a photoelectric conversion apparatus, an imaging system, and a moving body.

Description of the Related Art

Imaging devices such as CMOS image sensors and CCD image sensors (photoelectric conversion apparatuses) are widely used for example in digital still cameras and digital video cameras. A photoelectric conversion apparatus includes a charge holding unit which temporarily holds charge converted by a photoelectric converting unit at a location separately from the photoelectric converting unit. More specifically, the charge holding unit is used as a floating diffusion unit (hereinafter referred to as an FD unit) as an input node of an amplifying circuit or a device for simultaneously holding all the pixel charges for global shutter operation.

When a charge holding unit is provided on the same semiconductor substrate as the photoelectric converting unit, light may come into the charge holding unit which holds charges and optical noise may be generated as a result. Japanese Patent Application Publication No. 2013-65688 discloses a solution to such optical noise generation. More specifically, according to the disclosure, a light shielding unit is provided between the photoelectric converting unit and the charge holding unit.

However, the configuration disclosed in Japanese Patent Application Publication No. 2013-65688 is not capable of sufficiently shielding light and may allow light to leak into the charge holding unit. The light incident on the charge holding unit may be photoelectrically converted, so that noise-causing charge may be generated, and a pixel signal may be degraded as a result.

SUMMARY OF THE INVENTION

It is an object of the present invention to provide a photoelectric conversion apparatus which allows a better pixel signal to be obtained.

The first aspect of the disclosure is a photoelectric conversion apparatus, comprising: a semiconductor substrate having a first surface on which light is incident and a second surface opposite to the first surface; a photoelectric converting unit provided in the semiconductor substrate to convert incident light into charge; a charge holding unit provided in the semiconductor substrate to hold charge transferred from the photoelectric converting unit; a light shielding unit provided in a trench of the semiconductor substrate, the trench being formed between the photoelectric converting unit and the charge holding unit; and a transfer gate formed on a second surface side of the semiconductor substrate so as to overlap with the light shielding unit when viewed in a plan view for the second surface of the semiconductor substrate and configured to transfer the charge at the photoelectric converting unit to the charge holding unit, wherein a distance between the light shielding unit and the photoelectric converting unit is shorter than a distance between the light shielding unit and the charge holding unit.

According to the present invention, a better image signal can be obtained.

Further features of the present invention will become apparent from the following description of exemplary embodiments with reference to the attached drawings.

DESCRIPTION OF THE EMBODIMENTS

Hereinafter, semiconductor devices according to embodiments of the present invention will be described in conjunction with the accompanying drawings. Note that these embodiments are not intended to limit the present invention.

First Embodiment

The photoelectric conversion apparatus according to the embodiment is a CMOS image sensor. In general, the CMOS image sensor includes for example a pixel array unit, a vertical drive unit, a column processing unit, a horizontal drive unit, and a system control unit. The pixel array unit has a two-dimensional arrangement of unit pixels each having a photoelectric conversion element which generates optical charge for a charge amount corresponding to incident light amount and accumulates the photoelectric charge inside. Hereafter, the unit pixel will be described simply as a pixel, and the region of the photoelectric converting unit and the region of the charge holding unit will be particularly described. When the photoelectric conversion apparatus is used simply as an optical sensor rather than an image sensor, the photoelectric conversion apparatus needs only have at least one pixel, and do not have to have multiple pixels.

Figure 1:
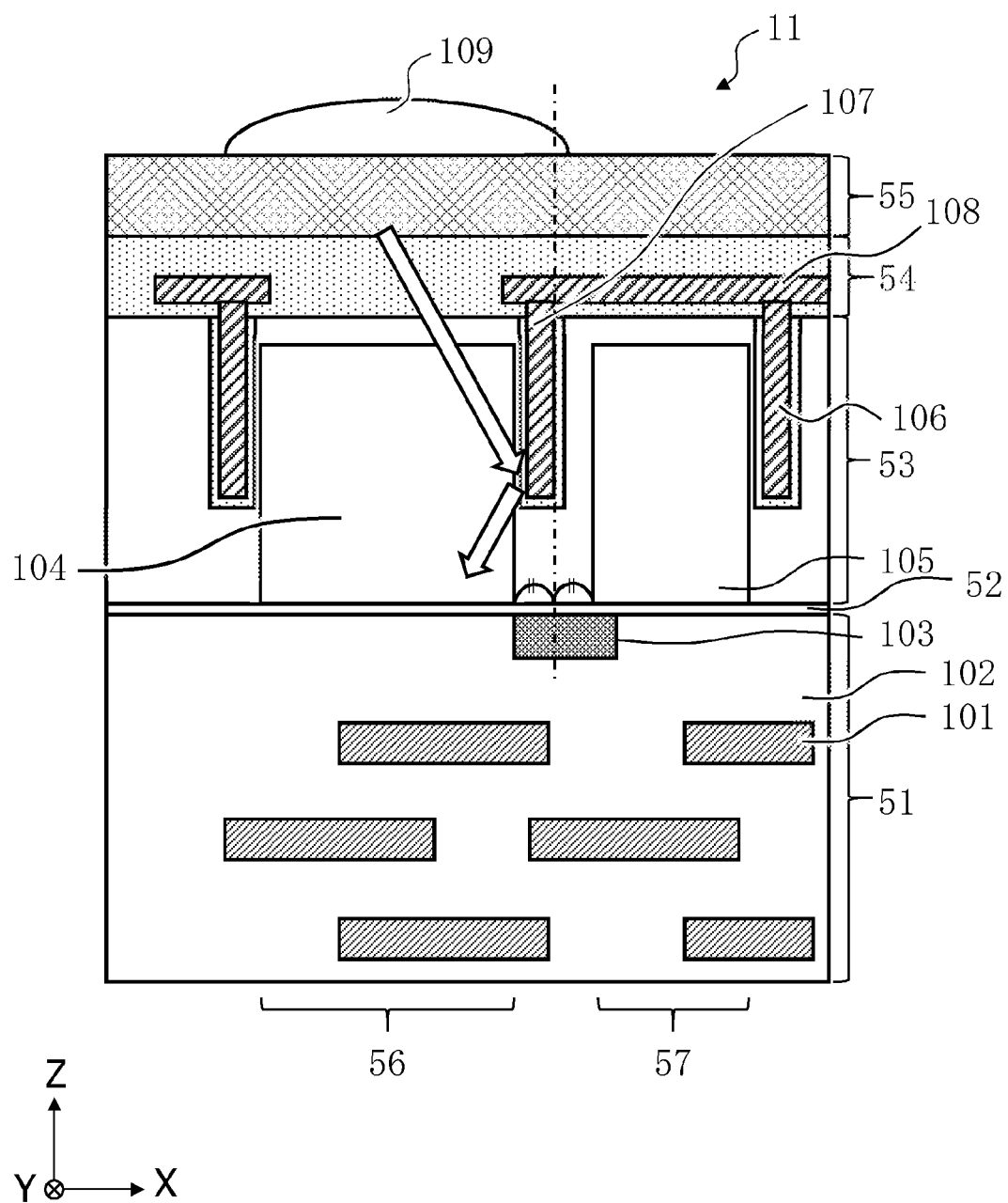
FIG. 1 is a sectional view showing an exemplary pixel according to a first embodiment of the present invention.
Figure 2:
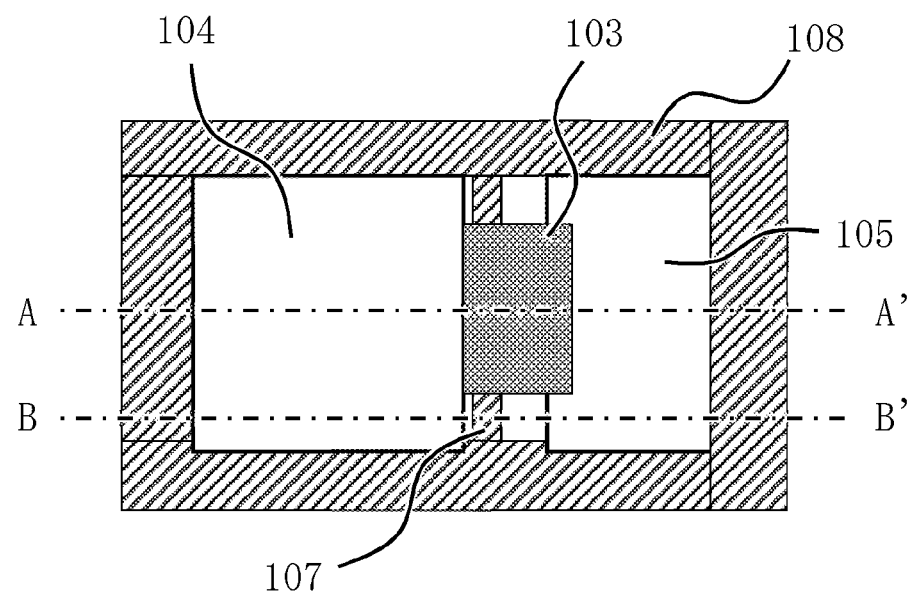
FIG. 2 is a plan view of the exemplary pixel according to the first embodiment.
Figure 2:
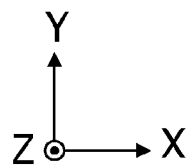

FIG. 1 is a sectional view of an exemplary pixel according to the first embodiment. FIG. 2 is a plan view of the exemplary pixel according to the first embodiment when viewed in the direction of incidence of light. FIG. 1 is a sectional view taken along line A-A' in FIG. 2.

As shown in FIG. 1, a pixel 11 includes a layered arrangement including a wiring layer 51, an oxide film 52, a semiconductor substrate 53, a dielectric material layer 54, a color filter layer 55, and an on-chip lens 109 placed on each other in this order from the lower side in FIG. 1. Although FIG. 1 shows one pixel 11, multiple pixels 11 may each have the structure shown in FIG. 1. The region in which the photoelectric converting unit 104 is formed in the semiconductor substrate 53 will be referred to as a photoelectric converting unit region (first region) 56, and the region in which the charge holding unit 105 is formed in the semiconductor substrate 53 will be referred to as a charge holding unit region (second region) 57. The pixel 11 also has a floating diffusion region (hereinafter referred to as an FD) and an amplifying transistor (neither of which is shown) which outputs a signal corresponding to charge stored in the FD. In general, the semiconductor substrate 53 has two surfaces. According to the embodiment, for convenience sake, the upper surface in FIG. 1 is a first surface. Meanwhile, the lower surface in FIG. 1 is a second surface. As shown in FIG. 1, the wiring layer 51 is disposed on the semiconductor substrate 53 on the side of the second surface. Meanwhile, light enters the semiconductor substrate 53 from the side of the first surface. More specifically, the photoelectric conversion apparatus according to the embodiment is a so-called backside illumination type CMOS image sensor in which incident light is irradiated from a surface opposite to the surface of the semiconductor substrate 53 on which the wiring layer is disposed.

The photoelectric converting unit 104 converts light received through the on-chip lens 109 into charge. The charge holding unit 105 temporarily holds the charge transferred from the photoelectric converting unit 104. According to the voltage supplied to a transfer gate 103, charge transfer from the photoelectric converting unit 104 to the charge holding unit is controlled. According to the embodiment, the charge holding unit 105 holds an electron as signal charge. Therefore, the photoelectric converting unit 104 and the charge holding unit 105 each include an N-type semiconductor region disposed in the semiconductor substrate 53. The N-type is the conductivity type of the semiconductor region. The majority carriers of the semiconductor region have the same polarity as the signal charge held by the charge holding unit has. When holes are treated as the signal charge, the photoelectric converting unit 104 and the charge holding unit 105 each include a P-type semiconductor region disposed in the semiconductor substrate 53.

The wiring layer 51 includes multiple layers of wires 101 and is formed on the opposite side to the light receiving surface of the photoelectric converting unit 104. The light receiving surface of the photoelectric converting unit 104 is a part of the first surface of the semiconductor substrate 53. The wiring layer 51 is formed by embedding the multiple wires 101 in an interlayer insulating film 102. The multiple wires 101 transfer or hold a control signal used for reading charge at the photoelectric converting unit 104 or a signal based on the charge at the photoelectric converting unit 104.

A substrate support (not shown) may be disposed under the wiring layer 51. For example, elements (not shown) such as transistors formed at the wiring layer 51 and the semiconductor substrate 53 may form a charge readout circuit, and a post-read-out AD conversion circuit and a circuit in a succeeding stage may be formed at the substrate support. More specifically, the photoelectric conversion apparatus according to the embodiment may be a so-called layered image sensor. Such an arrangement allows the image sensor to be driven at high speed or to achieve high functionality.

The transfer gate 103 is disposed on the semiconductor substrate 53 with the oxide film 52 interposed therebetween in the region of the wiring layer 51 between the photoelectric converting unit 104 and the charge holding unit 105. The transfer gate 103 is formed on the second surface side of the semiconductor substrate 53 so as to overlap with the light shielding unit when viewed in a plan view for the second surface of the semiconductor substrate 53. When a predetermined voltage is applied to the transfer gate 103, the charge stored at the photoelectric converting unit 104 is transferred to the charge holding unit 105. The oxide film 52 is insulating and forms the gate insulating film of the transfer gate 103. More specifically, the N-type semiconductor region of the photoelectric converting unit 104, the transfer gate 103, and the N-type semiconductor region of the charge holding unit 105 form a MOS transistor.

A light shielding film 108, a light shielding unit 106, and a light shielding unit 107 are embedded in the dielectric material layer 54. The light shielding film 108, the light shielding unit 106, and the light shielding unit 107 are all made of a material having a light shielding property.

The light shielding film 108 is formed on the light receiving surface side (the upper side in the figure) of the semiconductor substrate 53 to shield incoming light to the charge holding unit 105. The light shielding film 108 is formed to cover at least a part of the charge holding unit 105, and preferably to cover the entire charge holding unit 105. Covering the charge holding unit 105 with the light shielding film 108 means that the region of the charge holding unit 105 is included in the region of the light shielding film 108 in a plan view. More preferably, the light shielding film 108 is formed to cover all the regions except the region of the photoelectric converting unit 104. In this way, incident light on the charge holding unit can be further reduced. The light shielding film 108 can be made of a material such as tungsten, aluminum, and copper to more effectively prevent incident light from coming into the charge holding unit 105. Note that the light shielding film 108 may be omitted and the charge holding unit 105 may be exposed in a plane view from the second surface side. An advantageous effect can be provided in that a better pixel signal may be obtained by the presence of the light shielding unit 106 when the charge holding unit 105 is exposed.

The light shielding unit 106 and the light shielding unit 107 are formed to have a predetermined depth so that these units surround the photoelectric converting unit 104 and the charge holding unit 105 and extend in a direction perpendicular to the light shielding film 108 (the direction normal to the light shielding film 108). The semiconductor substrate 53 has trenches for providing the light shielding unit 106 and the light shielding unit 107. When the light shielding unit 106 and the light shielding unit 107 are made of a conductive material, the trenches may be each provided with an insulating material to insulate between the light shielding unit 106 or the light shielding unit 107 and the semiconductor substrate 53 in addition to the light shielding unit 106 or the light shielding unit 107. Note that the light shielding unit formed between the photoelectric converting unit 104 and the charge holding unit 105 is referred to as the light shielding unit 107 and the other part is referred to as the light shielding unit 106. It may also be considered that the light shielding unit 107 is disposed between the photoelectric converting unit region (first region) 56 and the charge holding unit region (second region) 57 of the semiconductor substrate 53. Stated differently, the light shielding unit 107 is disposed between the photoelectric converting unit region 56 and the charge holding unit region 57 on a line passing through the photoelectric converting unit region 56 and the charge holding unit region 57 of the semiconductor substrate 53. Unless the light shielding unit 107 and the light shielding unit 106 are described separately, what is described about one of the light shielding unit 107 and the light shielding unit 106 applies to the other.

When the light shielding unit 107 is formed in the trench of the semiconductor substrate 53 and the trench reaches the second surface of the semiconductor substrate 53 (the surface provided with the transfer gate 103), charge transfer is not allowed. Therefore, at least in a region in which a transfer channel is to be formed between the photoelectric converting unit 104 and the charge holding unit 105, the trenches provided with the light shielding unit 107 and the light shielding unit 107 are separated from the second surface of the semiconductor substrate 53. All the parts of the light shielding unit 107 may be provided apart from the transfer gate 103 or the second surface of the semiconductor substrate 53. Similarly, the light shielding unit 106 may be provided apart from the second surface of the semiconductor substrate 53. In this way, the configuration is advantageous in that the entire light shielding unit 106 and the entire light shielding unit 107 are formed to have a similar depth, so that increase in the manufacturing steps does not result.

Figure 3:
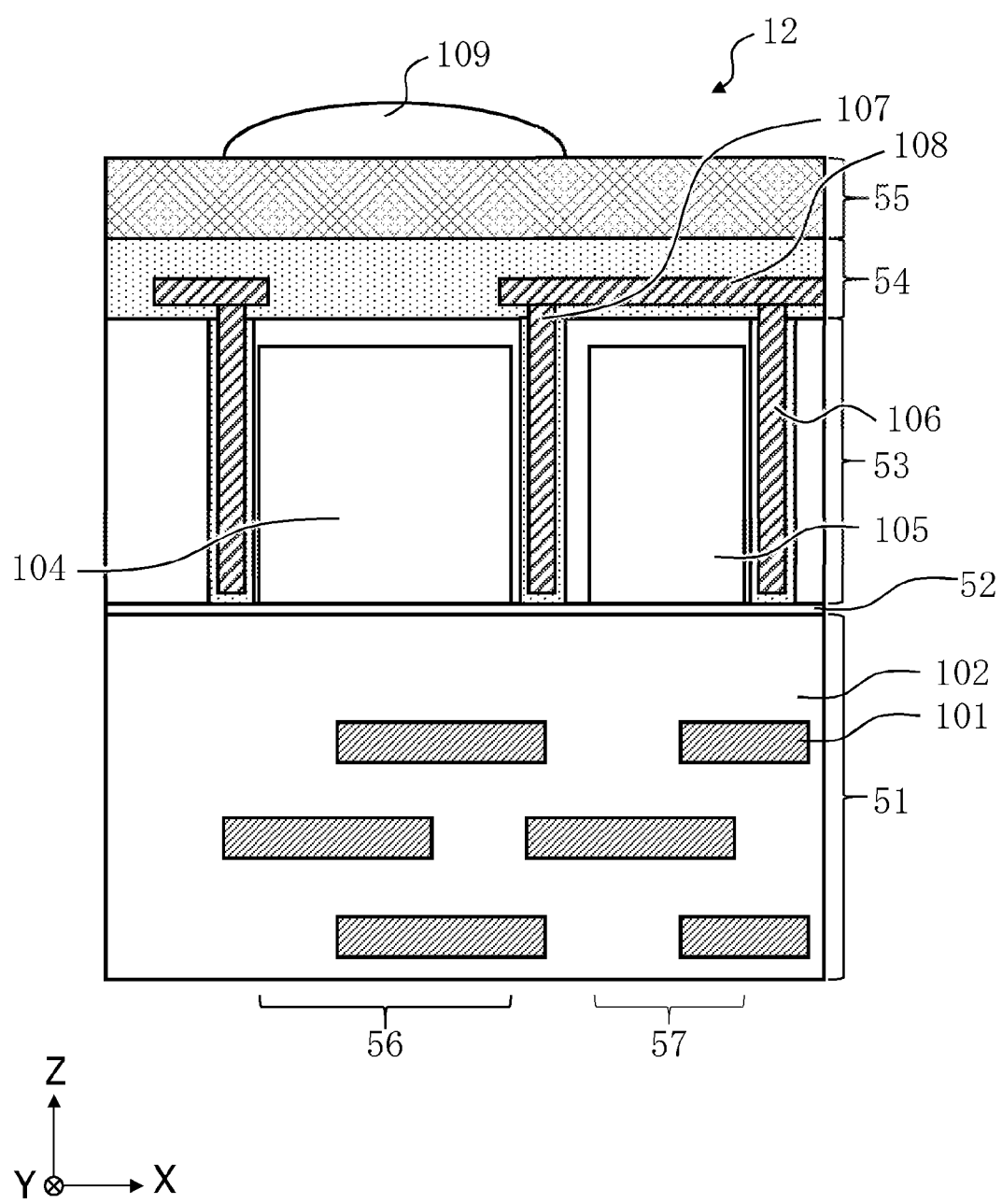
FIG. 3 is a sectional view taken along line B-B' in FIG. 2.

However, when the light shielding unit 107 is provided apart from the second surface of the semiconductor substrate 53, incident light may enter the charge holding unit 105 for example between the light shielding unit 107 and the second surface of the semiconductor substrate 53. Therefore, the light shielding unit 107 is desirably provided to extend to the second surface of the semiconductor substrate 53 at least in a part of the region other than directly under the transfer gate 103 as shown in FIGS. 2 and 3 in order to prevent incident light from coming into the charge holding unit 105. In this case, the trenches provided with the light shielding unit 107 penetrate from the first surface to the second surface of the semiconductor substrate 53. This can reduce oblique incident light coming into the charge holding unit 105.

In the example in FIG. 1, while the light shielding unit 106 is provided apart from the second surface of the semiconductor substrate 53, the light shielding unit 106 may also be provided in contact with the second surface of the semiconductor substrate 53. This can reduce optical noise attributable to crosstalk or the like of incident light on adjacent pixels.

FIG. 3 shows an exemplary arrangement in which a part of the light shielding unit 107 and the light shielding unit 106 are disposed in contact with the surface of the semiconductor substrate 53. FIG. 3 is a sectional view taken along line B-B' in FIG. 2.

An arbitrary voltage may be supplied to the light shielding unit 106, the light shielding unit 107, and the light shielding film 108. For example, the light shielding unit 106, the light shielding unit 107, and the light shielding film 108 are fixed to a ground potential (GND). When the potential of the light shielding unit 106 changes, the potential of other nodes having parasitic coupling capacitance with respect to the light shielding unit 106 may also change, in other words, crosstalk may occur. The potential change for example at the light shielding unit 106 can be caused by a control circuit when the potential at the light shielding unit 106 is controlled. The potential change for example at the light shielding unit 106 may also be caused by the potential change of another node when the light shielding unit 106 is in a floating state. In contrast, when the potential at the light shielding unit 106 is fixed, the influence of crosstalk or the like attributable to the change in the potential at the light shielding unit 106, the light shielding unit 107, and the light shielding film 108 may be reduced.

Figure 4:
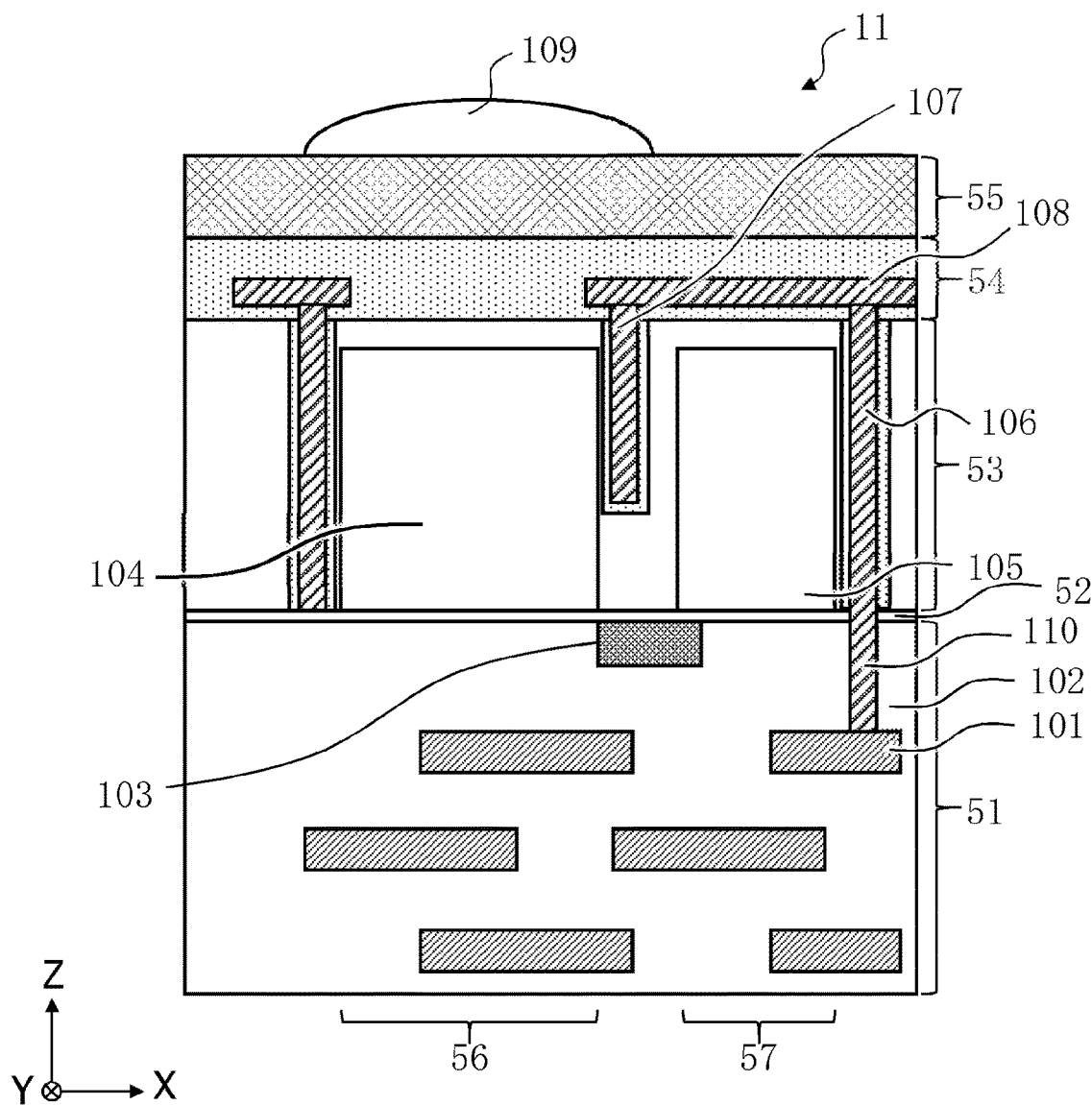
FIG. 4 is a view for illustrating an exemplary method for fixing charge at a light shielding film and light shielding units according to the first embodiment.

FIG. 4 shows an exemplary method for supplying voltage to the light shielding unit 106, the light shielding unit 107, and the light shielding film 108. In the example in FIG. 4, the wire 101 and the light shielding unit 106 are directly connected through a contact part 110. In another example, the light shielding film 108 and the wiring may be connected on the side of the dielectric material layer 54, so that voltage can be supplied to the light shielding film 108. However, in this case, an additional wire should be provided on the side of the dielectric material layer 54, which may limit the pixel layout, reduce the aperture ratio, and reduce pixel performance. In yet another example, a high density diffusion layer may be provided near the second surface of the semiconductor substrate 53, and the contact part 110 may be electrically connected to the light shielding unit 106 through the diffusion layer. In this way, the light shielding unit 106 does not have to be formed deep, which makes the manufacturing process easier.

The potential is desirably fixed on a pixel-basis. The potential fixation on a pixel-basis can reduce inter-pixel potential change among the light shielding unit 106, the light shielding unit 107, and the light shielding film 108, so that the influence of crosstalk attributable to capacitive coupling with the wire 101 can be further reduced. In this example, a substrate support is provided under the wiring layer 51 in a layered structure. In this way, there is no need for an additional wire on the side of the dielectric material layer 54, a higher degree of flexibility in pixel layout is obtained, and the aperture ratio can be increased.

According to the embodiment, the light shielding units 106 and 107 are made of a material such as tungsten, aluminum, and copper similarly to the light shielding film 108. This can prevent crosstalk of incident light on adjacent pixels and incident light from coming into the charge holding unit 105, so that optical noise can be reduced.

Figure 5A:
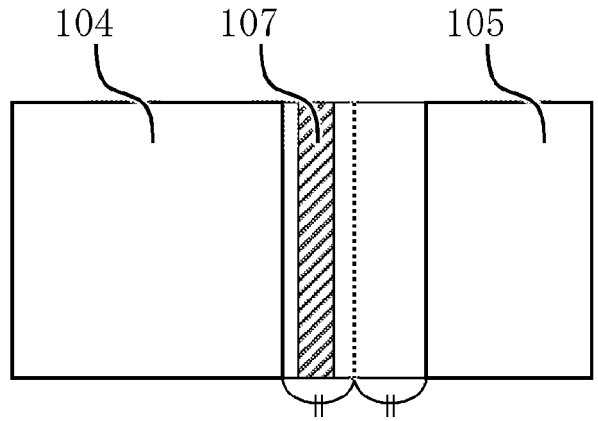
FIGS. 5A to 5C are views of exemplary arrangements of the light shielding unit according to the first embodiment.
Figure 5B:
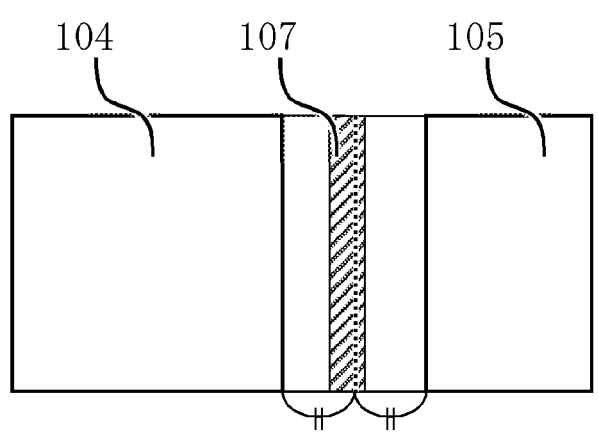
Figure 5C:
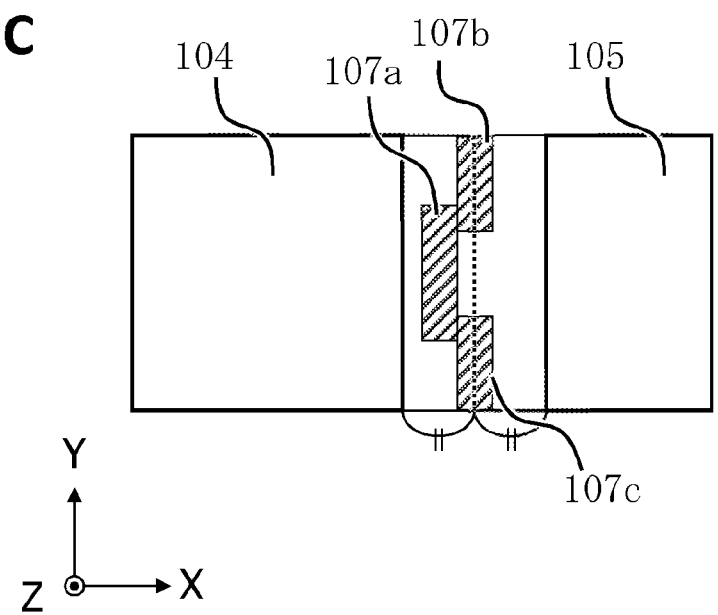

According to the embodiment, the light shielding unit 107 between the photoelectric converting unit 104 and the charge holding unit 105 is disposed in a position closer to the photoelectric converting unit 104 than the charge holding unit 105. Stated differently, the distance between the light shielding unit 107 and the photoelectric converting unit 104 is shorter than the distance between the light shielding unit 107 and the charge holding unit 105. More specifically, the distance between the light shielding unit 107 and the N-type semiconductor region of the photoelectric converting unit 104 is shorter than the distance between the light shielding unit 107 and the N-type semiconductor region of the charge holding unit 105. If at least a part of the light shielding unit 107 satisfies this condition, the arrangement of the light shielding unit 107, the light shielding unit 106, and the light shielding film 108 is not limited to a particular form. As described above, the light shielding unit 106 and the light shielding film 108 do not have to be provided. Hereinafter, the arrangement of the light shielding unit 107 will be described with reference to FIGS. 5A to 5C. FIGS. 5A to 5C are plan views showing only the photoelectric converting unit 104, the charge holding unit 105, and the light shielding unit 107.

FIG. 5A shows the same structure as that shown in FIGS. 1 and 2, and all the parts of the light shielding unit 107 are disposed in a region closer to the photoelectric converting unit 104 than the midpoint between the photoelectric converting unit 104 and the charge holding unit 105 in a direction in which the photoelectric converting unit 104 and the charge holding unit 105 are adjacent to each other (the X-direction).

However, as shown in FIG. 5B, the center of the light shielding unit 107 in the X-direction needs only be on the side of the photoelectric converting unit 104 with respect to the midpoint between the photoelectric converting unit 104 and the charge holding unit 105. Stated differently, a part of the light shielding unit 107 may be in a region closer to the charge holding unit 105 than the midpoint between the photoelectric converting unit 104 and the charge holding unit 105.

In the examples shown in FIGS. 5A and 5B, the distance in the X-direction from the photoelectric converting unit 104 to the light shielding unit 107 is smaller than the distance in the X-direction from the charge holding unit 105 to the light shielding unit 107 in all positions in the Y-direction. However, this is not indispensable. As shown in FIG. 5C, at least in some parts of the light shielding unit 107 in the Y-direction, the distance in the X-direction from the photoelectric converting unit 104 to the light shielding unit 107 may be smaller than the distance in the X-direction from the charge holding unit 105 to the light shielding unit 107. Such an arrangement can provide an advantageous effect in that incident light can be prevented from entering. Since a large amount of light enters the center of the pixel, the central part 107a of the light shielding unit 107 in the Y-direction is preferably provided in a position closer to the photoelectric converting unit 104 than the charge holding unit 105. The peripheral parts 107b and 107c of the light shielding unit 107 may be provided between the photoelectric converting unit 104 and the charge holding unit 105 or in a region closer to the charge holding unit 105. In the position where the light shielding unit 107 overlaps the transfer gate 103, the light shielding unit 107 is preferably disposed in a position closer to the photoelectric converting unit 104 than the charge holding unit 105.

According to the embodiment, incident light can be effectively prevented from entering the charge holding unit 105. When light enters a pixel in an oblique direction, the incident light is collected by the on-chip lens 109 and transmitted through the color filter layer 55, the dielectric material layer 54, the semiconductor substrate 53, and the photoelectric converting unit 104. The transmitted light is shielded by the light shielding unit 107 as denoted by the thick arrows in FIG. 1. According to the embodiment, at least a part of the light shielding unit 107 is disposed near the photoelectric converting unit 104. As a result, the incident light on the charge holding unit region 57 can be reduced and optical noise can be further reduced as compared to the conventional case.

If light incident on the photoelectric converting unit 104 of the semiconductor substrate 53 can be at least partly shielded, the advantageous effect of the present embodiment can be obtained. The presence of light entering the charge holding unit 105 in any of other paths regardless of the amount is not related to the problem to be solved by the embodiment. For example, it may be desirable in some cases that the charge holding unit 105 is configured to be shielded against light in a particular direction and receive light in another direction.

Second Embodiment

Figure 6:
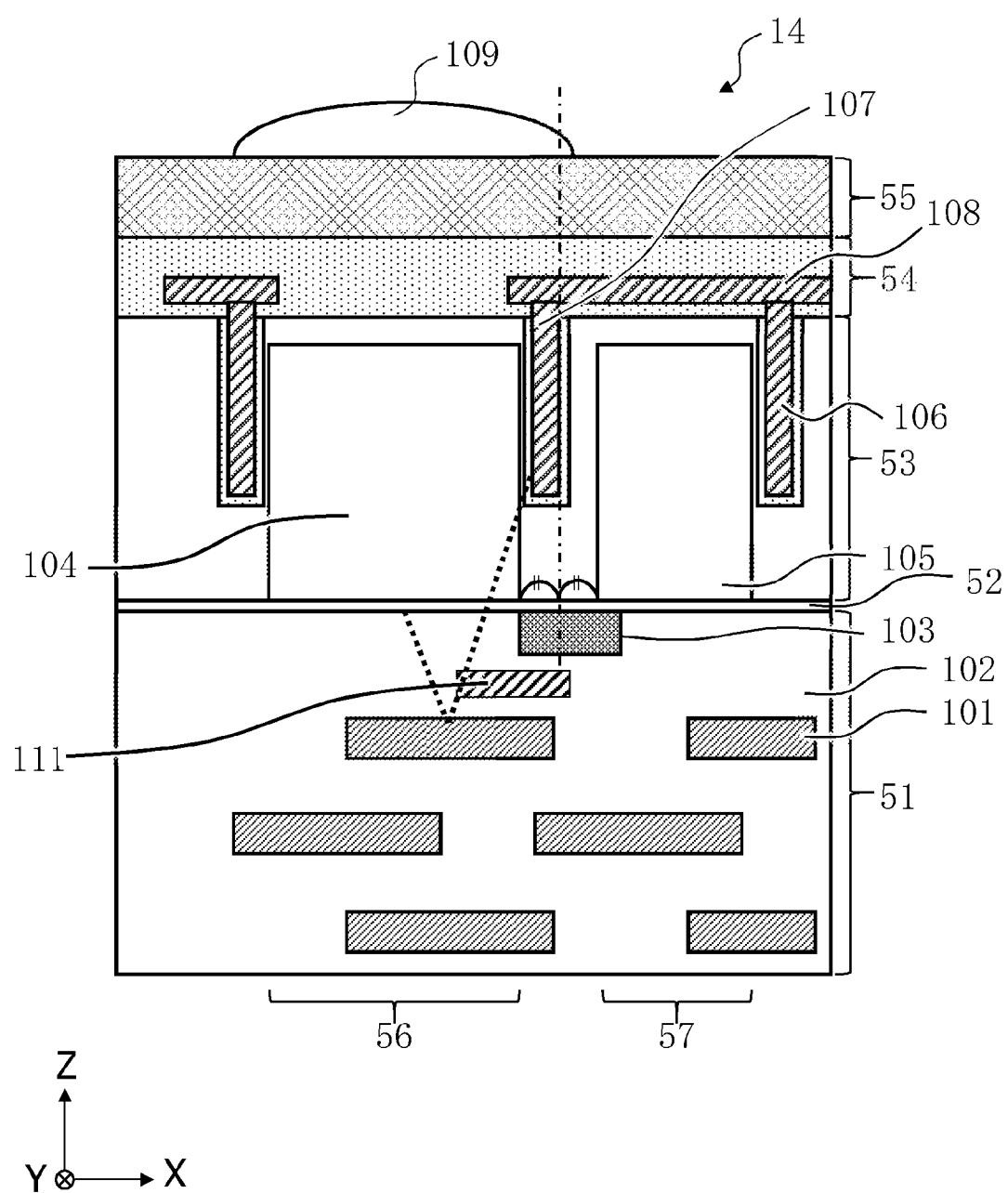
FIG. 6 is a sectional view of an exemplary pixel according to a second embodiment of the present invention.
Figure 7:
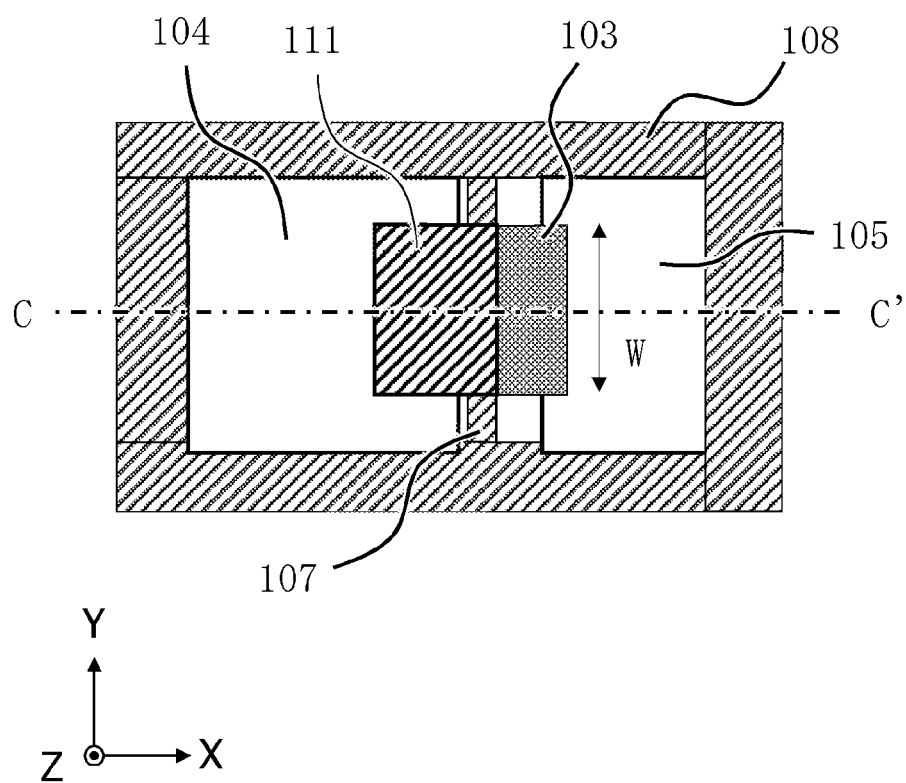
FIG. 7 is a plan view of the exemplary pixel according to the second embodiment.

FIG. 6 is a sectional view of an exemplary pixel according to a second embodiment of the invention. FIG. 7 is a plan view of the exemplary pixel according to the second embodiment as viewed in the direction of incidence of light. FIG. 6 is a sectional view taken along line C-C' in FIG. 7. Portions having the same functions as those in FIGS. 1 to 5 are denoted by the same reference characters. The descriptions of the same elements as those in FIGS. 1 to 5 are applied, as appropriate, to FIGS. 6 and 7.

As shown in FIG. 6, a pixel 14 includes a layered arrangement including a wiring layer 51, an oxide film 52, a semiconductor substrate 53, a dielectric material layer 54, a color filter layer 55, and an on-chip lens 109 placed on each other in this order from the lower side in FIG. 6. Although FIG. 6 shows one pixel 14, multiple pixels 14 may each have the structure shown in FIG. 6. The region in which the photoelectric converting unit 104 is formed in the semiconductor substrate 53 will be referred to as a photoelectric converting unit region 56, and the region in which the charge holding unit 105 is formed in the semiconductor substrate 53 will be referred to as a charge holding unit region 57. The photoelectric conversion apparatus according to the embodiment is a so-called backside illumination type CMOS image sensor in which incident light is irradiated from a surface opposite to the surface of the semiconductor substrate 53 on which the wiring layer is arranged.

The wiring layer 51 includes multiple layers of wires 101 and is formed on the opposite side to the light receiving surface of the photoelectric converting unit 104. The light receiving surface of the photoelectric converting unit 104 is a part of the first surface of the semiconductor substrate 53. The wiring layer 51 is formed by embedding the multiple wires 101 in an interlayer insulating film 102. The multiple wires 101 transfer or hold a control signal used for reading charge at the photoelectric converting unit 104 or a signal based on the charge at the photoelectric converting unit 104.

A transfer gate 103 is disposed on the semiconductor substrate 53 with the oxide film 52 interposed therebetween in the region of the wiring layer 51 between the photoelectric converting unit 104 and the charge holding unit 105. The transfer gate 103 is disposed on the side of the second surface of the semiconductor substrate 53. When a predetermined voltage is applied to the transfer gate 103, charge stored at the photoelectric converting unit 104 is transferred to the charge holding unit 105. The oxide film 52 is insulating and forms the gate insulating film of the transfer gate 103. More specifically, the N-type semiconductor region of the photoelectric converting unit 104, the transfer gate 103, and the N-type semiconductor region of the charge holding unit 105 form a MOS transistor.

A light shielding film 108, a light shielding unit 106, and a light shielding unit 107 made of a material having a light shielding property are embedded in the dielectric material layer 54. The light shielding film 108, the light shielding unit 106, and the light shielding unit 107 are each made of a material having a light shielding property.

The light shielding film 108 is formed to cover at least the charge holding unit 105. The light shielding unit 106 and the light shielding unit 107 are formed to have a predetermined depth so that these units surround the photoelectric converting unit 104 and the charge holding unit 105 and extend in a direction perpendicular to the light shielding film 108 (in the direction normal to the light shielding film 108). The semiconductor substrate 53 is provided with trenches for providing the light shielding unit 106 and the light shielding unit 107. When the light shielding unit 106 and the light shielding unit 107 are made of a conductive material, the trenches may be provided with an insulating material to insulate the light shielding unit 106 or the light shielding unit 107 from the semiconductor substrate 53 in addition to the light shielding unit 106 or the light shielding unit 107. Note that the light shielding unit formed between the photoelectric converting unit 104 and the charge holding unit 105 is referred to as the light shielding unit 107 and the other part is referred to as the light shielding unit 106. Unless the light shielding unit 107 and the light shielding unit 106 are described separately, what is described about one of the light shielding unit 107 and the light shielding unit 106 applies to the other.

When the light shielding unit 107 is formed in the trench of the semiconductor substrate 53 and the trench reaches the second surface of the semiconductor substrate 53 (the surface provided with the transfer gate 103), charge transfer is not allowed. Therefore, at least in a region in which a transfer channel is to be formed between the photoelectric converting unit 104 and the charge holding unit 105, the trenches provided with the light shielding unit 107 and the light shielding unit 107 are separated from the second surface of the semiconductor substrate 53. All the parts of the light shielding unit 107 may be provided apart from the transfer gate 103 or the second surface of the semiconductor substrate 53. Similarly, the light shielding unit 106 may be provided apart from the second surface of the semiconductor substrate 53. In this way, the configuration is advantageous in that the entire light shielding unit 106 and the entire light shielding unit 107 are formed to have a similar depth, so that increase in the manufacturing steps does not result.

However, when the light shielding unit 107 is provided apart from the second surface of the semiconductor substrate 53, incident light may enter the charge holding unit 105 for example from between the light shielding unit 107 and the surface of the semiconductor substrate 53. Therefore, the light shielding unit 107 is desirably provided to extend to the surface of the semiconductor substrate 53 at least in a part of the region other than directly under the transfer gate 103 as shown in FIG. 2 in order to prevent incident light from coming into the charge holding unit 105. In this case, the trench provided with the light shielding unit 107 penetrates from the first surface to the second surface of the semiconductor substrate 53. This can reduce oblique incident light coming into the charge holding unit 105.

In the example in FIG. 6, the light shielding unit 106 is provided apart from the semiconductor substrate 53, but the light shielding unit 106 may also be provided in contact with the surface of the semiconductor substrate 53. Such a configuration can reduce optical noise for example attributable to crosstalk of light incident on adjacent pixels.

An arbitrary voltage may be supplied to the light shielding unit 106, the light shielding unit 107, and the light shielding film 108. For example, the light shielding unit 106, the light shielding unit 107, and the light shielding film 108 are fixed to a grounding potential (GND). When the potential at the light shielding unit 106 changes, the potential at other nodes having parasitic coupling capacitance with respect to the light shielding unit 106 may also change, in other words, crosstalk may occur. The potential change for example at the light shielding unit 106 can be caused by a control circuit when the potential at the light shielding unit 106 is controlled. The potential change for example at the light shielding unit 106 may be caused by the potential change at another node when for example the light shielding unit 106 is in a floating state. On the other hand, the potential for example at the light shielding unit 106 is fixed, the influence of crosstalk or the like caused by the change in the potential at the light shielding unit 106, the light shielding unit 107, and the light shielding film 108 may be reduced. The method for fixing the potential is described in connection with the first embodiment and therefore will not be described.

The light shielding unit 106 and the light shielding unit 107 are made of a material such as tungsten, aluminum, and copper similarly to the light shielding film 108. This can prevent crosstalk of incident light on adjacent pixels and the incident light from coming into the charge holding unit 105, so that optical noise can be reduced.

The light shielding unit 107 between the photoelectric converting unit 104 and the charge holding unit 105 is disposed in a position closer to the photoelectric converting unit than the charge holding unit 105. Details of the arrangement of the light shielding unit 107 are described in connection with the first embodiment and therefore will not be described.

As described in connection with the first embodiment, oblique incident light on the photoelectric converting unit 104 may enter the charge holding unit 105. In addition to this path, light transmitted through the semiconductor substrate 53 may be reflected by the wiring layer 51, and the reflected light may enter the charge holding unit 105. Specifically, light in an oblique direction to the pixel 14 may be transmitted through the photoelectric converting unit 104 and the oxide film 52 and enter the wiring layer 51. When the incident light is reflected on the wire 101 disposed in the photoelectric converting unit region 56, the reflected light may enter the charge holding unit 105 from between the transfer gate 103 and the light shielding unit 107 or the surface of the semiconductor substrate 53.

According to the second embodiment, a light shielding film 111 is disposed between the transfer gate 103 and the wire closest to the transfer gate 103 among the plurality of wires 101 embedded in the interlayer insulating film 102 in the wiring layer. In FIG. 6, the light shielding film 111 is disposed between the transfer gate 103 and the uppermost wire 101. In this way, light transmitted through the photoelectric converting unit 104 and reflected by the wire 101 embedded in the interlayer insulating film 102 can be shielded by the light shielding film 111, so that the light is prevented from entering the charge holding unit region 57. When the light shielding film 111 is not provided, it is assumed that light reflected by the wire 101 enters the charge holding unit 105 and optical noise is generated. According to the embodiment, generation of such noise can be prevented.

The light shielding film 111 is desirably formed in a position where the light reflected by the wire 101 reaches the lower end of the light shielding unit 107 closer to the photoelectric converting unit 104 as shown by the dotted line in FIG. 6. This allows the reflected light from the wire 101 to be shielded more effectively.

The light shielding film 111 can be widely disposed so that the light shielding film 111 covers at least the charge holding unit region 57. Covering the charge holding unit region 57 by the light shielding film 111 means that the charge holding unit region 57 or the region of the charge holding unit 105 is included in the region of the light shielding film 111 in a plan view. As the light shielding film 111 is widely disposed, the light reflected from the multiple wires 101 disposed in the wiring layer 51 can be shielded.

On the other hand, the light shielding film 111 disposed in the photoelectric converting unit region 56 may give rise to generation of the reflected light to the charge holding unit 105 or may cause increase in parasitic capacitance between the wires 101 and the light shielding film 111. Therefore, the region for disposing the light shielding film 111 is desirably minimized. For this purpose, the light shielding film 111 and the light shielding unit 107 may be configured as follows. The light shielding unit 107 is provided in contact with the surface of the semiconductor substrate 53 other than directly under the transfer gate 103 as in the first embodiment shown in FIG. 3. The light shielding film 111 is disposed to cover a part of the photoelectric converting unit 104 and the transfer gate 103. Since the film covers the transfer gate 103, the light shielding film 111 has a width equal to the gate width W. When there is a gap between the light shielding unit 107 and the transfer gate 103, the part immediately under the transfer gate 103 or the space between the light shielding unit 107 and the transfer gate 103 serves as a path for the reflected light to enter. Therefore, when the light shielding film 111 is provided as described above, the reflected light can be prevented from coming into the charge holding unit 105. Further, when the light shielding film 111 is formed to have a larger width than the gate width W, and the transfer gate 103 is not provided, the light shielding film 111 can be disposed at the lower part of the region in which the light shielding unit 107 is not in contact with the surface of the semiconductor substrate 53, so that even a higher advantageous effect may be obtained.

In this way, reflected light from the light shielding film 111 is minimized, and the parasitic capacitance of the conductive material by the light shielding film 111 can be reduced.

In the above example, the light shielding film 111 has a width greater than or equal to the gate width of the transfer gate 103 and is formed to cover the transfer gate 103, while the light shielding film 111 may be formed to cover at least a part of the transfer gate 103. Therefore, the light shielding film 111 may cover a part of the photoelectric converting unit 104 and may have a smaller width than the gate width of the transfer gate 103. In this way, the reflected light from the wires 101 can be at least partly shielded, and the parasitic capacitance of the conductive material by the light shielding film 111 can be minimized.

Although not shown in FIG. 6, an arbitrary fixed potential, such as GND, is set to avoid the influence of crosstalk attributable to capacitive coupling between the light shielding film 111 and the wire 101.

According to the embodiment, incident light can be prevented from entering the charge holding unit 105 even more effectively. When light enters a pixel in an oblique direction, the incident light is collected by the on-chip lens 109 and transmitted through the color filter layer 55, the dielectric material layer 54, the semiconductor substrate 53, the photoelectric converting unit 104, and the oxide film 52. When the transmitted light is reflected by the wires 101 in the photoelectric converting unit region 56, the light can be shielded effectively by the light shielding film 111. As a result, the incident light on the charge holding unit region 57 can be reduced and optical noise can be reduced.

Third Embodiment

Figure 8:
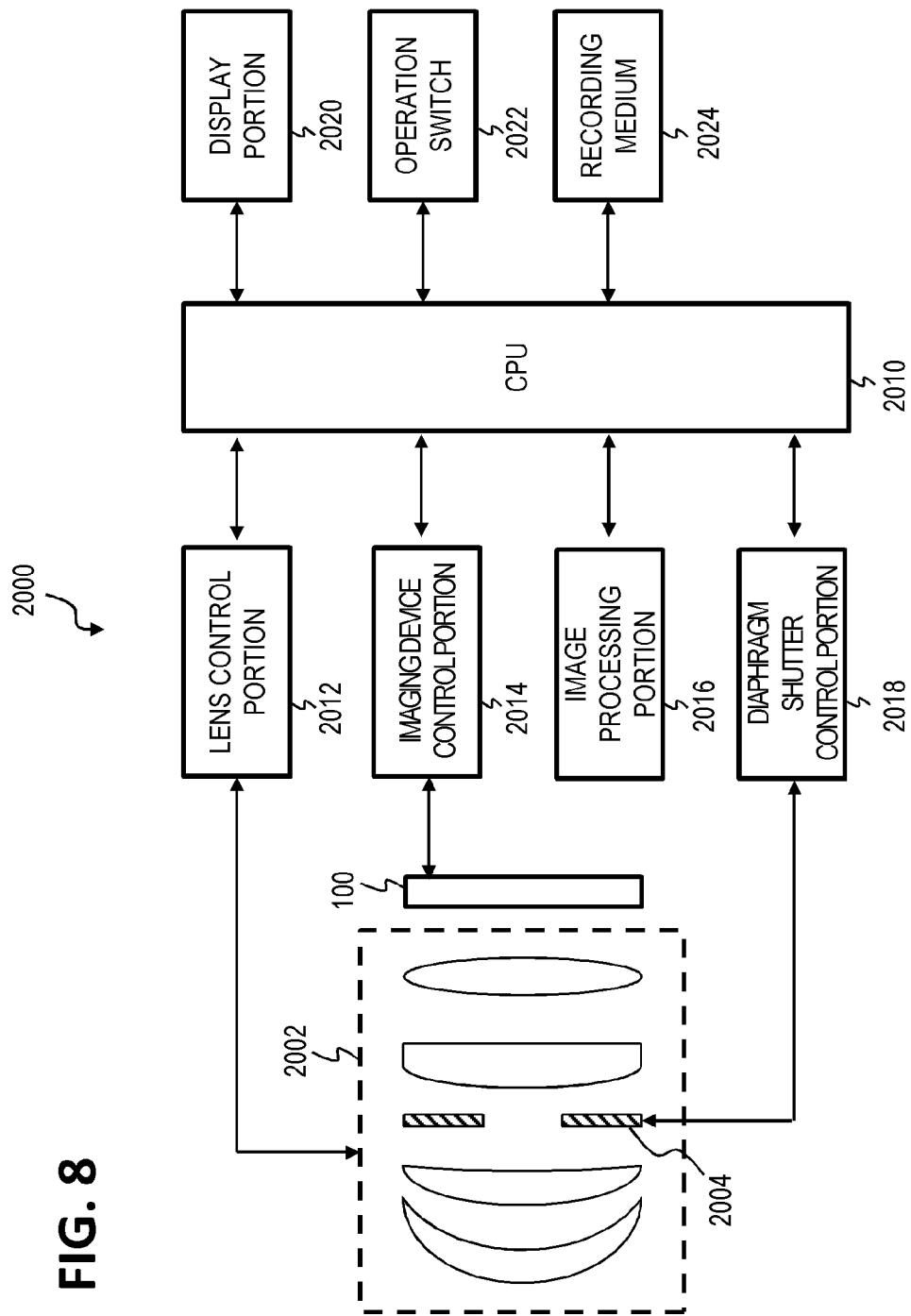
FIG. 8 is a view of an exemplary imaging system according to a third embodiment of the present invention.

An imaging system according to a third embodiment of the present invention will be explained with reference to FIG. 8. FIG. 8 is a block diagram of a schematic configuration of an imaging system according to this embodiment.

The solid-state imaging devices (photoelectric conversion devices) described in the above first and second embodiments may apply to various imaging systems. Applicable imaging systems may include, but are not limited to, various types of equipment such as a digital still camera, a digital camcorder, a monitor camera, a copying machine, a facsimile, a mobile phone, an in-vehicle camera, an observation satellite, a medical camera, or the like. The imaging systems may also include a camera module including an optical system such as a lens and a solid-state imaging device (photoelectric conversion device). FIG. 8 is a block diagram of a digital still camera as an example of those imaging systems.

FIG. 8 shows an imaging system 2000, which includes an imaging device 100, an imaging optical system 2002, a CPU 2010, a lens control portion 2012, an imaging device control portion 2014, an image processing portion 2016, and a diaphragm shutter control portion 2018. The imaging system 2000 also includes a display portion 2020, an operation switch 2022, and a recording medium 2024.

The imaging optical system 2002 is an optical system for forming an optical image of the subject, and includes a lens group, a diaphragm 2004, or the like. The diaphragm 2004 has a function of adjusting light intensity during photography by adjusting its opening size. The diaphragm 2004 also functions as an exposure time adjustment shutter during still image photography. The lens group and the diaphragm 2004 are held movable forward and backward in the optical axis direction. These linked operations may provide a scaling function (zoom function) and a focus adjustment function. The imaging optical system 2002 may be integrated into the imaging system or may be an imaging lens mountable to the imaging system.

The imaging device 100 is disposed such that its imaging plane is positioned in the image space of the imaging optical system 2002. The imaging device 100 is one of the photoelectric conversion devices (solid-state imaging devices) explained in the first and second embodiments. The imaging device 100 includes a CMOS sensor (pixel portion) and its peripheral circuits (peripheral circuit area). The imaging device 100 includes a plurality of pixels arranged in two dimensions, each pixel including a photoelectric conversion portion. These pixels are provided with color filters to form a two-dimensional single-plate color sensor. The imaging device 100 may photoelectrically convert a subject image imaged by the imaging optical system 2002 for output as an image signal and/or a focus detection signal.

The lens control portion 2012 is to control the forward and backward driving of the lens group in the imaging optical system 2002 to perform scaling operation and focus adjustment. The lens control portion 2012 includes a circuit and/or processing unit configured to achieve those functions. The diaphragm shutter control portion 2018 is to change the opening size of the diaphragm 2004 (for a variable diaphragm value) to adjust light intensity during photography, and is constituted of a circuit and/or processing unit configured to achieve those functions.

The CPU 2010 is a control unit in a camera responsible for various controls of the camera bod, and includes an operation portion, a ROM, a RAM, an A/D converter, a D/A converter, a communication interface circuit, or the like. The CPU 2010 controls the operation of each portion in the camera according to a computer program stored in a ROM or the like. The CPU 2010 performs a series of photography operations such as AF, imaging, image processing, and recording, including detection of the focus state (focus detection) of the imaging optical system 2002. The CPU 2010 also serves as a signal processing portion.

The imaging device control portion 2014 is to control the operation of the imaging device 100 and to A/D convert a signal output from the imaging device 100 and transmit the result to the CPU 2010, and includes a circuit and/or control unit configured to achieve those functions. The imaging device 100 may have the A/D conversion function. The image processing portion 2016 is a processing unit that subjects the A/D converted signal to processing such as □ conversion and color interpolation to generate an image signal. The image processing portion 2016 includes a circuit and/or control unit configured to achieve those functions. The display portion 2020 is a display device such as a liquid crystal display device (LCD), and displays information related to a photography mode of the camera, a preview image before photography, a check image after photography, the focused state at the focus detection, or the like. The operation switch 2022 includes a power supply switch, a release (photography trigger) switch, a zoom operation switch, a photography mode selection switch, or the like. The recording medium 2024 is to record a photographed image or the like, and may be built in the imaging system or removable such as a memory card.

In this way, the imaging system 2000 applied with the imaging device 100 according to the first and second embodiments may provide a high performance imaging system.

Fourth Embodiment

Figure 9A:
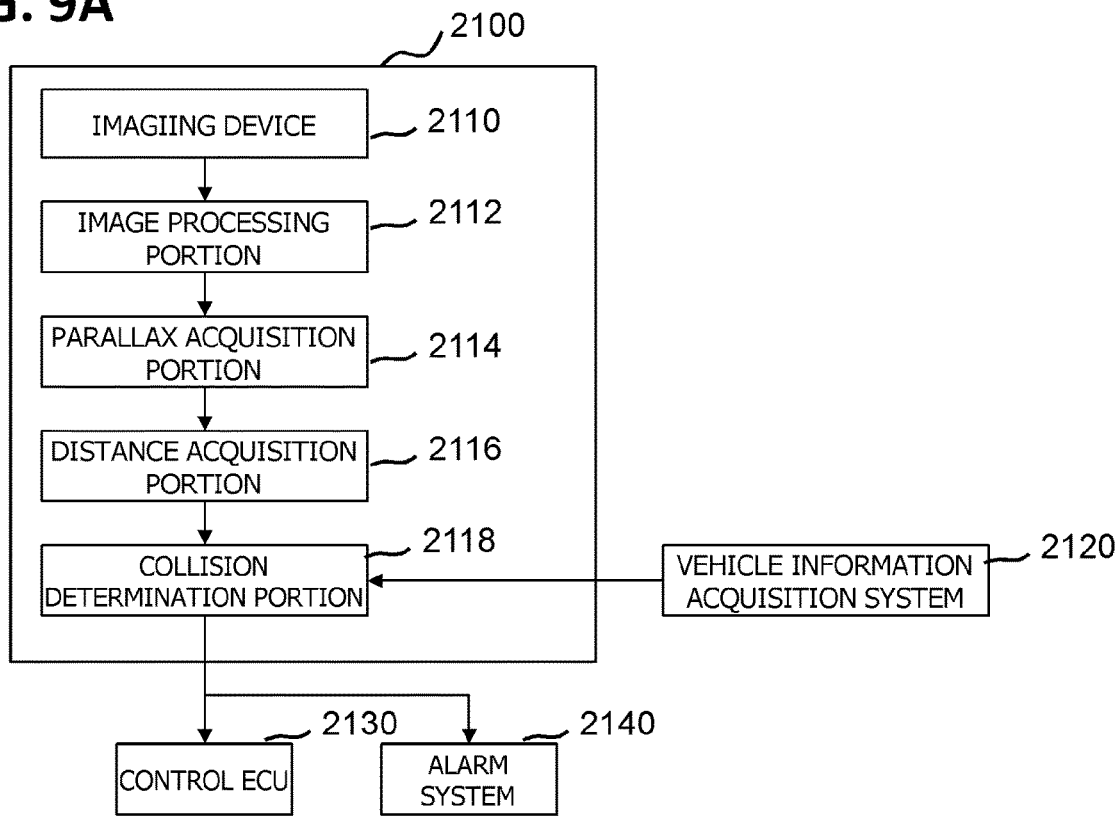
FIGS. 9A and 9B illustrate an exemplary imaging system and an exemplary moving body according to a fourth embodiment of the present invention.
Figure 9B:
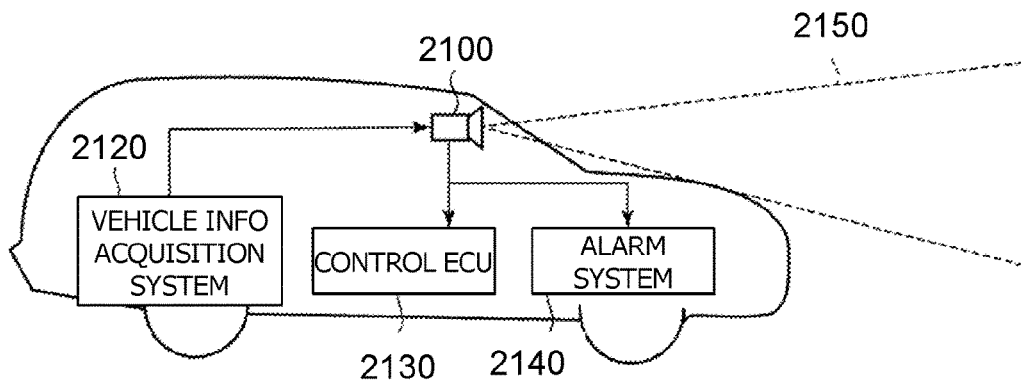

An imaging system and a mobile object according to a fourth embodiment of the present invention will be explained with reference to FIGS. 9A and 9B. FIGS. 9A and 9B show configurations of the imaging system and mobile object according to this embodiment.

FIG. 9A shows an example of an imaging system 2100 associated with an in-vehicle camera. The imaging system 2100 has an imaging device 2110. The imaging device 2110 is any one of the solid-state imaging devices (photoelectric conversion devices) according to the above first to third embodiments. The imaging system 2100 has an image processing portion 2112 and a parallax acquisition portion 2114. The image processing portion 2112 is a processing unit that subjects a plurality of sets of image data acquired by the imaging device 2110 to image processing. The parallax acquisition portion 2114 is a processing unit that calculates parallax (a phase difference of a parallax image) from the sets of image data acquired by the imaging device 2110. The imaging system 2100 also includes a distance acquisition portion 2116, which is a processing unit that calculates the distance to the subject based on the calculated parallax. The imaging system 2100 also includes a collision determination portion 2118, which is a processing unit that determines a possibility of collision based on the calculated distance. Here, the parallax acquisition portion 2114 and the distance acquisition portion 2116 are examples of information acquiring means that acquires information such as distance information to the subject. In other words, the distance information is information related to parallax, defocus amount, the distance to the subject, or the like. The collision determination portion 2118 may determine a possibility of collision using any of the distance information. The above processing unit may be provided by specially designed hardware or may be provided by general hardware that performs operation based on a software module. In addition, the processing unit may be provided by a Field Programmable Gate Array (FPGA), an Application Specific Integrated Circuit (ASIC), or the like or may be provided by a combination thereof.

The imaging system 2100 is connected to a vehicle information acquisition system 2120, and may thus acquire vehicle information including a vehicle speed, a yaw rate, and a rudder angle. The imaging system 2100 also has a control ECU 2130 connected thereto. The ECU 2130 is a control unit that outputs a control signal for generating a braking force to the vehicle based on the determination by the collision determination portion 2118. In other words, the control ECU 2130 is an example of a mobile object control means that controls a mobile object based on the distance information. The imaging system 2100 is also connected to an alarm system 2140. The alarm system 2140 gives an alarm to the driver based on the determination by the collision determination portion 2118. For example, if the collision determination portion 2118 determines a high possibility of collision, the control ECU 2130 performs a vehicle control that avoids collision and reduces damage by braking, releasing the accelerator, limiting the engine output, or the like. The alarm system 2140 warns the user by sounding an alarm such as sound, displaying alarm information on a screen of a car navigation system or the like, giving vibration to a seatbelt and steering, or the like.

In this embodiment, the surroundings of the vehicle such as front or rear are imaged by the imaging system 2100. FIG. 9B shows the imaging system 2100 when imaging the front of the vehicle (imaging range 2150). The vehicle information acquisition system 2120 directs the imaging system 2100 to operate and perform imaging. Using the imaging devices according to the above first to third embodiments as the imaging device 2110, the imaging system 2100 in this embodiment may provide more improved ranging accuracy.

Although the above description shows an example control that prevents collision with other vehicles, the present invention may also apply to a control of autonomous driving following other vehicles, a control of autonomous driving preventing running over a traffic lane, or the like. In addition to a vehicle such as a car, the imaging system may also apply to, for example, a mobile object (transportation equipment) such as a vessel, an aircraft, or an industrial robot. The moving device in the mobile object (transportation equipment) is one of various types of drive sources, including an engine, a motor, a wheel, and a propeller. In addition to a mobile object, the imaging system may also apply to equipment, such as Intelligent Transport Systems (ITS), that commonly uses the object recognition.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2019-85947 filed on Apr. 26, 2019, which is hereby incorporated by reference herein in its entirety.

What is claimed is:

1. A photoelectric conversion apparatus, comprising:
a semiconductor substrate having a first surface on which light is incident and a second surface opposite to the first surface;
a photoelectric converting unit provided in the semiconductor substrate to convert incident light into charge;
a charge holding unit provided in the semiconductor substrate to hold charge transferred from the photoelectric converting unit;
a light shielding unit provided in a trench of the semiconductor substrate, the trench being formed between the photoelectric converting unit and the charge holding unit; and
a transfer gate formed on a second surface side of the semiconductor substrate so as to overlap with the light shielding unit when viewed in a plan view for the second surface of the semiconductor substrate and configured to transfer the charge at the photoelectric converting unit to the charge holding unit,
wherein a distance between the light shielding unit and the photoelectric converting unit is shorter than a distance between the light shielding unit and the charge holding unit.

2. The photoelectric conversion apparatus according to claim 1,
wherein the photoelectric converting unit includes a first semiconductor region of a first conductivity type, majority carriers of which have the same polarity as the charge held by the charge holding unit has,
wherein the charge holding unit includes a second semiconductor region of the first conductivity type, and
wherein a distance between the light shielding unit and the first semiconductor region of the photoelectric converting unit is shorter than a distance between the light shielding unit and the second semiconductor region of the charge holding unit.

3. The photoelectric conversion apparatus according to claim 1, wherein the trench provided at the semiconductor substrate is apart from the second surface at least in a part of a region overlapping the transfer gate in a plan view of the first surface or the second surface.

4. The photoelectric conversion apparatus according to claim 1, wherein the light shielding unit is provided in a region closer to the photoelectric converting unit than a midpoint between the photoelectric converting unit and the charge holding unit.

5. The photoelectric conversion apparatus according to claim 1,
wherein the light shielding unit has a part provided in a region other than immediately under the transfer gate, and
wherein the light shielding unit extends to the second surface of the semiconductor substrate at least in a part of the region other than immediately under the transfer gate.

6. The photoelectric conversion apparatus according to claim 1,
wherein the light shielding unit has a part provided in a region other than immediately under the transfer gate, and
wherein the trench in which the light shielding unit is provided penetrates from the first surface to the second surface of the semiconductor substrate in at least a part of the region other than immediately under the transfer gate.

7. The photoelectric conversion apparatus according to claim 1, wherein a first light shielding film is provided to cover at least a part of the charge holding unit on the first surface side of the semiconductor substrate.

8. The photoelectric conversion apparatus according to claim 7, wherein the first light shielding film is provided to cover the entire region excluding the photoelectric converting unit.

9. The photoelectric conversion apparatus according to claim 7, wherein the light shielding unit and the first light shielding film are made of a conductive material and at least one of the light shielding unit and the first light shielding film is supplied with voltage.

10. The photoelectric conversion apparatus according to claim 1, further comprising
a wiring layer formed on the second surface side of the semiconductor substrate, and
a second light shielding film is provided between the transfer gate and a wire in the wiring layer.

11. The photoelectric conversion apparatus according to claim 10, wherein the second light shielding film is provided between a wire nearest to the transfer gate in the wiring layer and the transfer gate.

12. The photoelectric conversion apparatus according to claim 10, wherein the second light shielding film is formed in a position to shield light arriving at a lower end of the light shielding unit nearer to the photoelectric converting unit as reflected light, the light arriving at a lower end after having been transmitted through the photoelectric converting unit and reflected by the wiring layer.

13. The photoelectric conversion apparatus according to claim 10, wherein the second light shielding film has a width greater than the gate width of the transfer gate.

14. The photoelectric conversion apparatus according to claim 10, wherein the second light shielding film covers the charge holding unit.

15. The photoelectric conversion apparatus according to claim 10, wherein the second light shielding film at least partly overlaps the transfer gate in a plan view of the first surface or second surface.

16. The photoelectric conversion apparatus according to claim 10, wherein the second light shielding film is made of a conductive material and supplied with voltage.

17. A photoelectric conversion apparatus comprising:
a semiconductor substrate having a first surface on which light is incident and a second surface opposite to the first surface;
a photoelectric converting unit provided in a first region of the semiconductor substrate to convert incident light into charge;
a charge holding unit provided in a second region of the semiconductor substrate to hold charge transferred from the photoelectric converting unit;
a light shielding unit provided between the first and second regions of the semiconductor substrate on a line passing through the first and second regions; and
a transfer gate formed on a second surface side of the semiconductor substrate so as to overlap with the light shielding unit when viewed in a plan view for the second surface of the semiconductor substrate and configured to transfer the charge at the photoelectric converting unit to the charge holding unit, wherein a distance between the light shielding unit and the photoelectric converting element is shorter than a distance between the light shielding film and the charge holding unit.

18. An imaging system comprising:
the photoelectric conversion apparatus according to claim 1; and
a signal processing unit which processes a signal output from the photoelectric conversion apparatus.

19. An imaging system comprising:
the photoelectric conversion apparatus according to claim 17; and
a signal processing unit which processes a signal output from the photoelectric conversion apparatus.

20. A moving body comprising:
the photoelectric conversion apparatus according to claim 1;
a moving device;
a processing device which obtains information from a signal output from the photoelectric conversion apparatus; and
a control unit which controls the moving device according to the information.

* * * * *